(12) United States Patent
Lusky et al.

(10) Patent No.: US 7,864,612 B2
(45) Date of Patent: Jan. 4, 2011

(54) READING ARRAY CELL WITH MATCHED REFERENCE CELL

(75) Inventors: Eli Lusky, Tel-Aviv (IL); Boaz Eitan, Hofit (IL); Guy Cohen, Yaad (IL); Eduardo Maayan, Kfar Saba (IL)

(73) Assignee: Spansion Israel Ltd, Netanya (IE)

( * ) Notice: Subject to any disclaimer, the term of this patent is extended or adjusted under 35 U.S.C. 154(b) by 0 days.

(21) Appl. No.: 12/292,654

(22) Filed: Nov. 24, 2008

(65) Prior Publication Data

US 2009/0231915 A1   Sep. 17, 2009

Related U.S. Application Data

(63) Continuation of application No. 11/580,995, filed on Oct. 16, 2006, now Pat. No. 7,457,183, which is a continuation of application No. 11/194,394, filed on Aug. 1, 2005, now Pat. No. 7,123,532, which is a continuation-in-part of application No. 10/662,535, filed on Sep. 16, 2003, now Pat. No. 6,954,393.

(51) Int. Cl.
*G11C 7/00* (2006.01)

(52) U.S. Cl. .................. 365/210.1; 365/210.14

(58) Field of Classification Search .............. 365/210.1, 365/210.14, 210.15, 185.03; 438/257
See application file for complete search history.

(56) References Cited

U.S. PATENT DOCUMENTS

| | | | |
|---|---|---|---|
| 4,388,705 A | 6/1983 | Sheppard |
| 4,389,705 A | 6/1983 | Sheppard |
| 4,527,257 A | 7/1985 | Cricchi |
| 4,667,217 A | 5/1987 | Janning |
| 5,147,904 A | 9/1992 | Liron |
| 5,172,338 A | 12/1992 | Mehrotra et al. |
| 5,241,497 A | 8/1993 | Komarek |
| 5,289,412 A | 2/1994 | Frary et al. |
| 5,295,108 A | 3/1994 | Higa |
| 5,305,262 A | 4/1994 | Yoneda |
| 5,345,425 A | 9/1994 | Shikatani |
| 5,349,221 A | 9/1994 | Shimoji |
| 5,359,554 A | 10/1994 | Odake et al. |
| 5,418,743 A | 5/1995 | Tomioka et al. |
| 5,434,825 A | 7/1995 | Harari |
| 5,450,341 A | 9/1995 | Sawada et al. |
| 5,450,354 A | 9/1995 | Sawada et al. |
| 5,521,870 A | 5/1996 | Ishikawa |
| 5,537,358 A | 7/1996 | Fong |
| 5,568,085 A | 10/1996 | Eitan et al. |
| 5,583,808 A | 12/1996 | Brahmbhatt |
| 5,754,475 A | 5/1998 | Bill et al. |
| 5,768,193 A | 6/1998 | Lee et al. |
| 5,784,314 A | 7/1998 | Sali et al. |
| 5,812,449 A | 9/1998 | Song |

(Continued)

*Primary Examiner*—Vu A Le
(74) *Attorney, Agent, or Firm*—Eitan Mehulal Law Group

(57) ABSTRACT

A method for reading a bit of a memory cell in a non-volatile memory (NVM) cell array, the method comprising providing a memory cell comprising a bit to be read and at least one other bit not to be read, and reading the bit to be read with respect to a multi-bit reference cell, the reference cell comprising a first bit at a first non-ground programmed state and a second bit at a second non-ground programmed state. Compared with the prior art, the present invention may enable achieving an improved sensing accuracy together with improved read disturb immunity.

15 Claims, 3 Drawing Sheets

U.S. PATENT DOCUMENTS

| | | |
|---|---|---|
| 5,812,456 A | 9/1998 | Hull et al. |
| 5,828,601 A | 10/1998 | Hollmer et al. |
| 5,841,700 A | 11/1998 | Chang |
| 5,847,441 A | 12/1998 | Cutter et al. |
| 5,886,927 A | 3/1999 | Takeuchi |
| 5,946,258 A | 8/1999 | Evertt et al. |
| 5,949,711 A * | 9/1999 | Kazerounian .......... 365/185.05 |
| 5,949,728 A | 9/1999 | Liu et al. |
| 5,969,993 A | 10/1999 | Takeshima |
| 6,011,725 A | 1/2000 | Eitan |
| 6,034,896 A | 3/2000 | Ranaweera et al. |
| 6,118,332 A | 9/2000 | Jabs |
| 6,118,692 A | 9/2000 | Banks |
| 6,128,226 A | 10/2000 | Eitan et al. |
| 6,134,156 A | 10/2000 | Eitan |
| 6,169,691 B1 | 1/2001 | Pasotti et al. |
| 6,205,056 B1 | 3/2001 | Pan et al. |
| 6,240,040 B1 | 5/2001 | Akaogi et al. |
| 6,317,364 B1 | 11/2001 | Guterman et al. |
| 6,331,950 B1 | 12/2001 | Kuo et al. |
| 6,396,741 B1 | 5/2002 | Bloom et al. |
| 6,490,204 B2 | 12/2002 | Bloom et al. |
| 6,493,266 B1 | 12/2002 | Yachareni et al. |
| 6,525,969 B1 | 2/2003 | Kurihara et al. |
| 6,552,387 B1 | 4/2003 | Eitan |
| 6,690,602 B1 * | 2/2004 | Le et al. ................ 365/185.33 |
| 6,768,165 B1 | 7/2004 | Eitan |
| 2002/0132436 A1 | 9/2002 | Eliyahu et al. |
| 2002/0191465 A1 | 12/2002 | Maayan et al. |
| 2003/0208663 A1 * | 11/2003 | Van Buskirk et al. ....... 711/156 |
| 2004/0257873 A1 * | 12/2004 | Shieh et al. .............. 365/185.2 |

* cited by examiner

READING ARRAY CELL WITH MATCHED REFERENCE CELL

CROSS-REFERENCE TO RELATED APPLICATIONS

This application is a continuation of U.S. patent application Ser. No. 11/580,995 filed Oct. 16, 2006 now U.S. Pat. No. 7,457,183 which is a continuation application of U.S. patent application Ser. No. 11/194,394 filed Aug. 1, 2005 now U.S. Pat. No. 7,123,532, which is a continuation-in-part application claiming benefit from U.S. patent application Ser. No. 10/662,535, filed Sep. 16, 2003 now U.S. Pat. No. 6,954,393, which are all hereby incorporated by reference in their entirety.

FIELD OF THE INVENTION

The present invention relates generally to operating memory cells of non-volatile memory arrays, and particularly to methods for operating multi-bit memory cells with respect to reference cells.

BACKGROUND OF THE INVENTION

As is well known in the art, non-volatile memory (NVM) cells may have bits stored therein that may be read, such as by means of a sense amplifier. In general, the sense amplifier determines the logical value stored in the cell by comparing the output of the cell with a reference level. If the current output is above the reference, the cell is considered erased (with a logical value of 1) and if the current output is below the reference, the cell is considered programmed (with a logical value of 0). (In terms of the threshold voltage of the cell itself, programming a cell increases the threshold voltage of the cell, whereas erasing decreases the threshold voltage.)

Typically, a sufficient difference is defined between the expected erased and programmed voltage levels so that noise on the output will not cause false results. Accordingly, a program verify (PV) reference level and an erase verify (EV) reference level may be defined with a sufficient margin therebetween.

The margin may help maintain the same reading for the programmed or erased state of the cell. The margin may be necessary to overcome imperfections in the reading process and to compensate for drifts in the cell's threshold voltage (e.g., caused by retention loss or program/erase disturbs). A reduction in the original margin due to imperfections in the reading process (e.g., due to operation at different operational conditions) is referred to as "margin loss."

Many NVM arrays employ a reference cell as the basis for comparing the output of an array cell for a read operation. The use of a reference cell may help compensate for changes in the array, e.g., due to voltage variations and temperature, and ensure a fairly stable reference for read operations.

As is well known, NVM cells may have more than one bit, such as dual-bit or multi-bit cells. One example of a dual or multi-bit cell is a nitride, read only memory (NROM) cell, described in such patents as Applicant's U.S. Pat. No. 6,490,204, entitled "Programming And Erasing Methods For An NROM Array", and Applicant's U.S. Pat. No. 6,396,741, entitled "Programming Of Nonvolatile Memory Cells", the disclosures of which are incorporated herein by reference. Programming an NROM cell may typically involve applying positive voltages to gate and drain terminals of the transistor, while the source may be grounded. Erasing an NROM cell, which is done in the same source/drain direction as programming, typically involves applying a negative voltage to the gate and a positive voltage to the drain, while the source may be floated.

In dual-bit NROM cells, each bit may be read in the direction opposite to that of its programming direction, referred to as a "reverse read". For convenience of explanation, the bits are referred to as the left bit and the right bit. Accordingly, in order to read the left bit, the right bit line is the drain and the left bit line is the source. Conversely, in order to read the right bit, the cell is read in the opposite direction, meaning that the left bit line is the drain and the right bit line is the source.

The left bit and the right bit may be at different programmed states. For example, one of the bits may be programmed while the other may be erased. When reading one of the bits in the cell, voltages are applied to the bit lines and word line to which the drain, source and gate terminals of the memory cell are connected. In order to prevent the unread bit from erroneously affecting or disturbing the bit being read, it is generally accepted that a relatively large drain-source voltage Vds (e.g., above 1.4 V) should be applied. Such a high Vds ensures that the bit not being read has negligible effect on the bit being read.

However, using a relatively high drain to source voltage during read is not free of problems. Such a high Vds may cause a read disturb effect on the second bit of the dual bit cell, causing its threshold voltage to increase. For example, FIG. 1 illustrates the time for the threshold voltage (Vt) to drift upwards by 100 mV as a function of the drain-source voltage (Vds). For example, for Vds of about 1.6 V, it would take about $3 \times 10^7$ seconds for the threshold voltage to drift up approximately 100 mV. It is seen that as the drain-source voltage Vds increases, the time for the threshold voltage to drift upwards by 100 mV decreases. In other words, the higher the Vds, the quicker the threshold voltage drifts upwards. After a large number of read cycles, the threshold voltage may drift up an intolerable amount, leading to erase margin loss, i.e., a loss in the margin of voltage level between the erased state voltage level and the read reference level.

SUMMARY OF THE PRESENT INVENTION

There is therefore provided, in accordance with a preferred embodiment of the present invention, a method including programming a first storage area of a multi-bit reference cell to a reference level and programming a second storage area of the reference cell to a second programmed level. During operation, the method includes comparing an output of a memory cell to an output of the multi-bit reference cell when reading the reference level.

Additionally, in accordance with a preferred embodiment of the present invention, the reference level and the second programmed level may be substantially equal or different.

Moreover, in accordance with a preferred embodiment of the present invention, the operation may be reading, program verifying or erase verifying and the reference cell may be a read reference cell, a program verify reference cell or an erase verify reference cell.

Further, in accordance with a preferred embodiment of the present invention, the reference cell may be a nitride read only memory (NROM) cell. It may store charge in a non-nitride layer. It may have two storage areas and/or a physical separation between the two storage areas.

Still further, in accordance with a preferred embodiment of the present invention, memory cell may have more than 2 analog levels.

There is also provided, in accordance with a preferred embodiment of the present invention, a method including creating a multi-bit reference cell which is minimally sensitive to temperature and during operation, comparing an output of a memory cell to an output of the multi-bit reference cell when reading the reference level.

Additionally, in accordance with a preferred embodiment of the present invention, the creating comprises programming at least two storage areas of the reference cell. The may include programming a first storage area to a reference level and programming a second storage area to a second programmed level.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
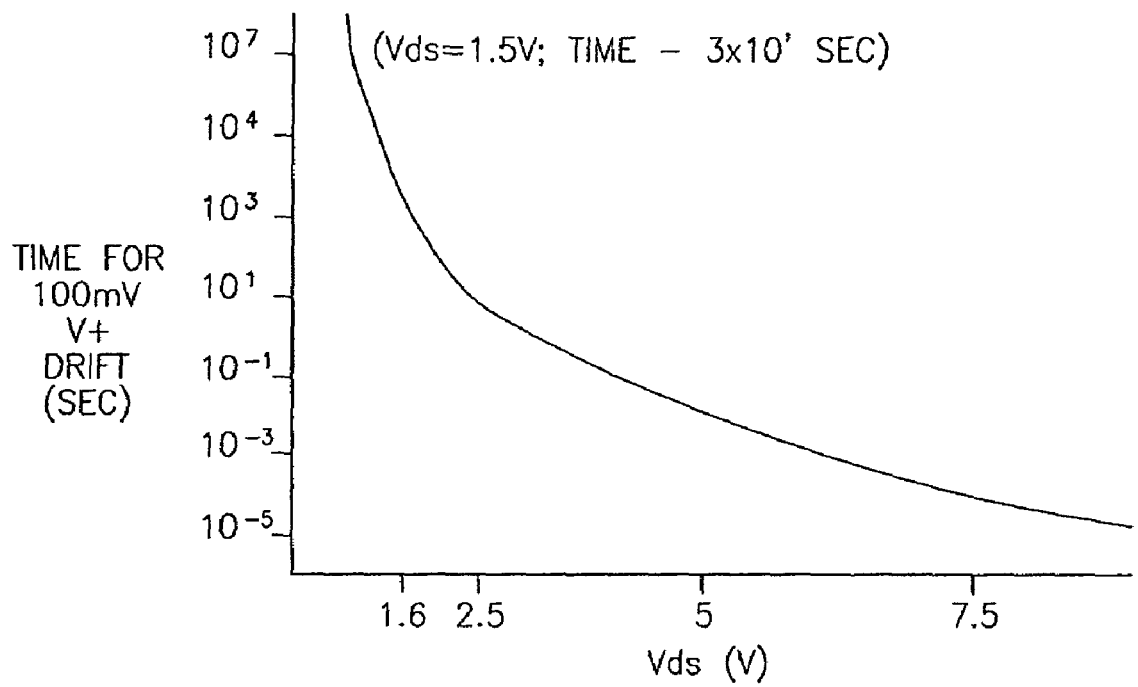
FIG. 1 is a simplified graphical illustration of the time required for a 100 mV threshold voltage upward drift of a NVM cell as a function of the drain-source voltage used in reading the cell.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

Figure 2:
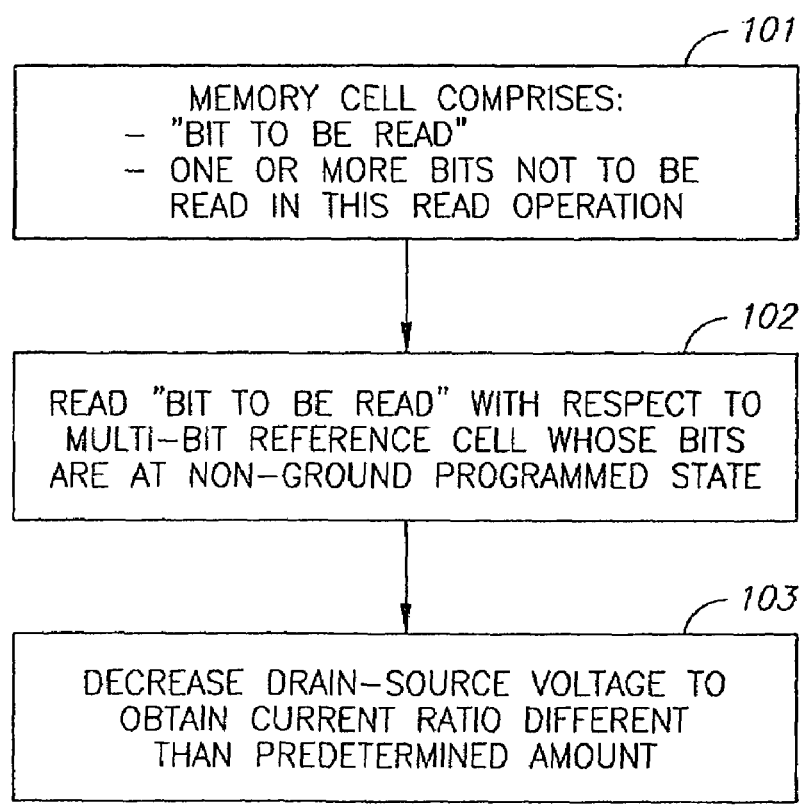
FIG. 2 is a simplified flow chart of a method for reading a bit of a memory cell, in accordance with an embodiment of the present invention.

Reference is now made to FIG. 2, which illustrates a method for reading a bit of a memory cell, in accordance with an embodiment of the present invention. The memory cell may comprise a bit to be read, and one or more other bits which are not to be read during this read operation (reference number 101 in FIG. 2). The other bits which are not read may be at erase or programmed states. The bit to be read may be in an erased state, which means that its threshold voltage is below a read reference level.

In the prior art, the bit to be read is read with respect to a first bit of a reference cell, which is at a read reference voltage level. A second bit of the reference cell is at an initial, unprogrammed state. In the initial state, the source is at or close to ground and ideally should remain close to ground. However, in real-world conditions that are not perfect, this initial state does not remain constant. For example, due to sensing and architecture array limitations, the source voltage generally increases during read operations. This may distort the sensed data due to a mismatch between the reference cell and the array cell.

In contrast, in the present invention, the bit to be read is read with respect to a multi-bit reference cell (in this example, a dual-bit reference cell) whose first bit is at a first read reference voltage level (i.e., a first non-ground programmed state), and whose second bit is at some non-ground (at least partially) programmed state, such as a second read reference voltage level (reference number 102 in FIG. 2). The second read reference voltage level may or may not be the same as the first read reference voltage level.

Figure 3:
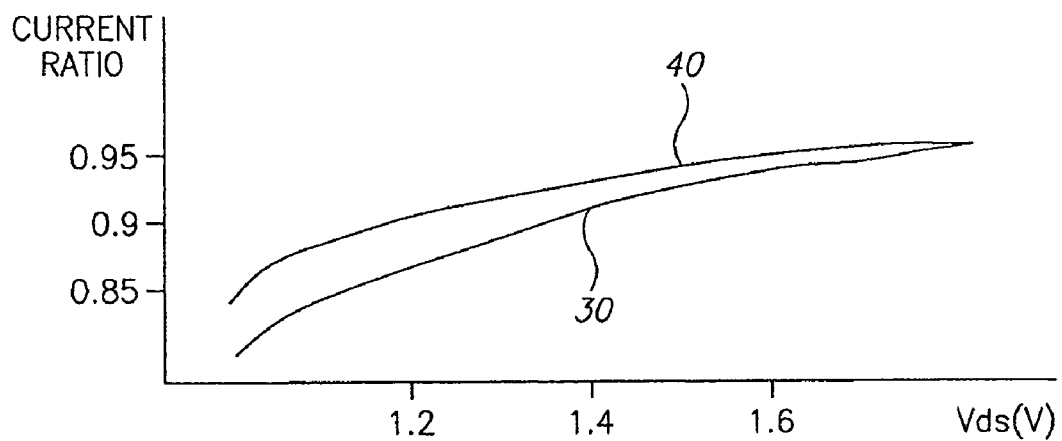
FIG. 3 is a simplified graphical illustration of a ratio of the sensed output current of an array cell to the current of a reference cell used to read the array cell, as a function of the drain-source voltage used to read the cell, in accordance with an embodiment of the invention.

Reference is now made to FIG. 3, which illustrates a ratio of the sensed output current of an array cell to the current of the reference cell used to read the array cell (referred to herein as the "current ratio"), as a function of the drain-source voltage (Vds) used to read the cell, in accordance with an embodiment of the invention.

In the design of a NVM array, it may be desirable to obtain a current ratio of a certain maximum magnitude, that is, a certain tolerable and acceptable current ratio loss. FIG. 3 illustrates an advantage of the present invention over the prior art, as is now explained.

Graph 30 is a plot of the current ratio vs. Vds for the case of reading an array cell whose first bit is at an erase/read level and whose second bit is programmed (that is, RD_PV) with respect to a reference cell of the prior art, whose first bit is at a read reference voltage level and whose second bit is at an initial, unprogrammed state (that is, RD_I). It is seen that for a given minimum current ratio, such as, for example, 0.90, in such a prior art read operation, Vds must be greater than or equal to 1.4 V.

Graph 40 is a plot of the current ratio vs. Vds for reading the same array cell (RD_PV) with respect to a reference cell of the present invention, whose first bit is at a first read reference voltage level and whose second bit is programmed to a read state (that is, RD_RD). It is seen that in order to attain the same minimum current ratio (in this example, 0.90), Vds needs only to be about 1.2 V. Thus, for a given current ratio loss, the invention enables application of a lower Vds. In other words, Vds may be decreased to obtain a different current ratio, such as greater than or equal to a predetermined amount (reference number 103 in FIG. 2). This also diminishes the read disturb effect on the second bit of the dual bit cell.

Applicants have further realized that, during operations other than reading, an array cell may be compared to other kinds of reference cells, typically by comparing current flow. For example, reference cells may be utilized during erase and programming operations to indicate the levels which define the erased and programmed states, respectively. These levels, known as erase verify (EV) and program verify (PV), respectively, may be utilized to decide on the conditions by which program and erase operations are concluded.

Figure 4:
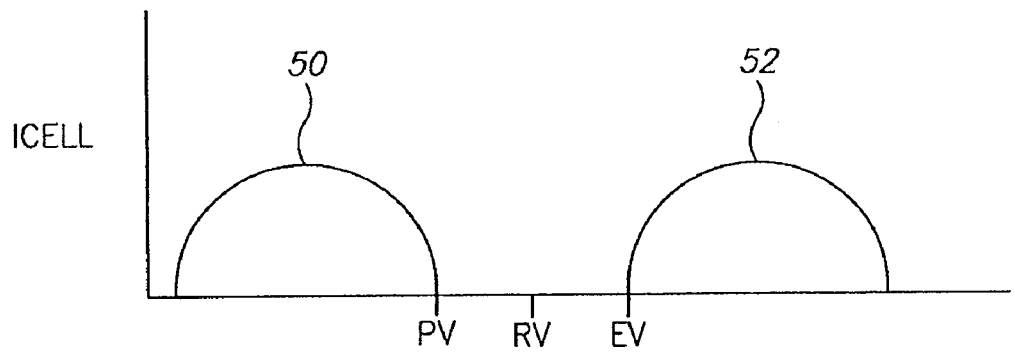
FIG. 4 is a schematic illustration of the reference levels used to operate array cells.

FIG. 4, to which reference is now made, illustrates three reference levels, program verify (PV), erase verify (EV) and read (RD) as a function of cell current. FIG. 4 also shows two distributions, a distribution 50 of programmed cells and a distribution 52 of erased cells. In this initial set of distributions (i.e. before the array is utilized), all of the erased cells have cell currents $I_{cell}$ above the erase verify level and all of the programmed cells have cell currents $I_{cell}$ below the program verify level.

To generate the distributions of FIG. 4, during programming, a sequence of programming pulses may be applied to the cell. During this sequence, the array cell may be read with respect to a program verify reference cell. If the current output of the NVM cell is above the current output of the program verify reference cell, the array cell may be considered "not programmed" and the programming pulse sequence may continue. However, if the current output of the array cell is below that of the program verify reference cell, the cell may be considered "program verified" and the programming sequence may stop.

For erasure, the erase pulse sequence may be applied to the array cell until the current of the array cell is larger than that of the erase verify reference cell. At that point, the array cell may be "erase verified" and the erase sequence may stop.

There may be further reference cells defining other reference levels to support different operations in the array.

Applicants have realized that it is important that a reference cell act similarly to the array cells under most, if not all, conditions and levels. Thus, if an array cell changes cell current, the reference array cell should change accordingly, in order for the comparison to maintain its usefulness. For example, an array cell programmed or erased at high temperature and re-measured at low temperature should generate similar results to an array cell programmed or erased at low temperature and re-measured at low temperature.

Figure 5A:
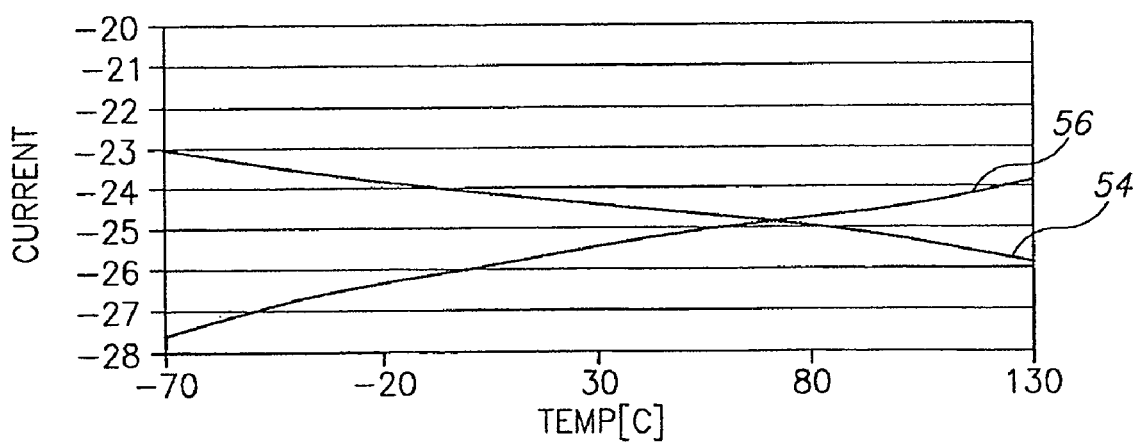
FIG. 5A is a graphical illustration of the effect of temperature in the prior art on the current of a erase verify reference cell and an erased cell.
Figure 5B:
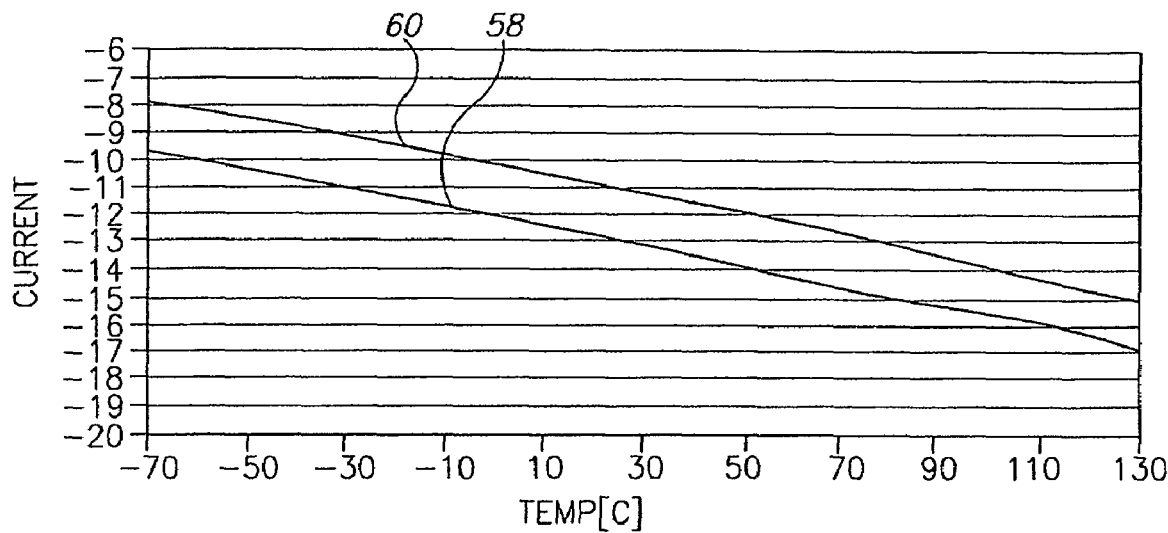
FIG. 5B is a graphical illustration of the effect of temperature in the prior art on the current of a program verify reference cell and a programmed cell.

Applicants have discovered that the prior art reference cells may be sensitive to temperature changes. This can be seen in FIGS. 5A and 5B, to which reference is now made. Both figures graph current of a reference cell and an array cell as a function of temperature. FIG. 5A graphs such for the erase verify reference cell (curve 54) and an erased cell (curve 56) and FIG. 5B graphs such for the program verify reference cell (curve 58) and a programmed cell (curve 60).

As can be seen in FIG. 5A, curves 54 and 56 cross and thus, there is a mismatch between the current change in the erase verify reference cell and in the erased cell. This is not true for the programming case. Curves 58 and 60 have similar slopes and thus, there is a good match between the current change in the program verify reference cell and in the programmed cell.

It can be inferred that, for higher temperatures, the program verify cell current may be increased and the erase verify cell current may be decreased. In this case, the margin between the two (i.e. the spread between the erase verify level and the program verify level) may be reduced and the reliability of the array may be degraded.

The different responses to temperature of the erase and program verify reference cells may result in program and erase verify decisions that are temperature dependent. For example, an array cell programmed or erased at high temperature and re-measured at low temperature may result in a different cell current than an array cell programmed or erased at low temperature and re-measured at low temperature. These temperature dependent decisions may degrade the program to erase margin of the array.

Furthermore, the read reference cell may also respond differently to temperature. This may affect the erase to read and program to read margins.

In accordance with a preferred embodiment of the present invention, the temperature sensitivity of multi-level reference cells may reduced. Reference cells which have two storage areas may have both storage areas programmed, possibly to different levels. One storage area may be programmed to the desired reference level. The second storage area may be programmed a minimal amount. The programming of the second storage area may help to reduce temperature sensitivity of the reference cells.

The reference cells may be any suitable multi-bit cells. For example, they may be NROM cells, such as those described hereinabove with respect to FIGS. 1-3, or they may be other types of NVM cells which store charge in a non-nitride layer. Alternatively, they may have a physical separation between the two storage areas. Furthermore, the multiple bits may be defined by having multiple threshold levels for each storage area, where each threshold level defines one end of a range for a different bit.

Figure 6:
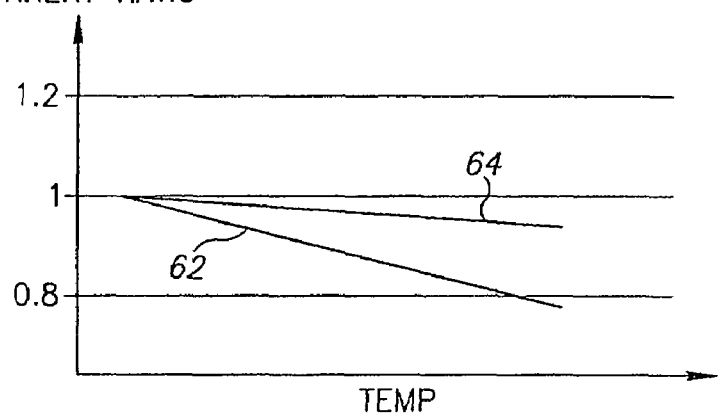
FIG. 6 is a graphical illustration of the current ratio of array erased cells to reference cells of prior art and to a reference cell of the present invention.

Reference is now made to FIG. 6, which graphs the current ratio vs. temperature for reading an erased array cell with respect to an erase verify reference cell of the present invention. For curve 62, the EV reference cell has one storage area programmed to the erase reference level and one non-programmed storage area. For curve 64, the reference cell has two programmed storage areas programmed to a level other than the ground level. For curve 64, the reference cell had one storage area programmed to the erase reference level while its second storage area was programmed to a level similar to that of a programmed reference cell.

It can be seen that curve 64 changes with temperature, but its slope is small (about 0.93) while curve 62 has a much larger slope (about 0.78). Thus, the reference cell whose second storage area is also programmed is less sensitive to temperature. It will be appreciated that programming the second storage area of any of the reference cells to some programming level, which may be the same or different than the programming level needed to provide the reference level, may reduce temperature sensitivity. This may improve the margins of operation in the memory array.

It will be appreciated by persons skilled in the art that the present invention is not limited by what has been particularly shown and described herein above. Rather the scope of the invention is defined by the claims that follow:

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A non-volatile memory ("NVM") device comprising a multi-charge-storage-region reference cell; and wherein said device is adapted to independently program each of at least two storage regions of said reference cell such that said reference cell is operated with both storage regions in a programmed state.

2. The device according to claim 1, wherein charge in a first charge storage region influences reading of a second charge storage region.

3. The device according to claim 1, wherein said reference cell stores charge in a non-nitride layer.

4. The device according to claim 1, wherein said reference cell stores charge in a charge trapping layer.

5. The device according to claim 4, wherein said reference cell is a charge trapping type NVM device.

6. The device according to claim 5, wherein said reference cell is a nitride read only memory (NROM) cell.

7. The device according to claim 1, wherein the charge storage regions of said reference cell are physically separated.

8. The device according to claim 1, wherein each of the charge storage regions is adapted to be charged to a difference threshold level.

9. The device according to claim 8, wherein said reference cell is adapted for reading each of at least two charge storage regions individually.

10. A non-volatile memory ("NVM") device comprising a set of multi-charge-storage-region reference cells, wherein said device is adapted to independently program each of two or more storage regions of each reference cell in the set such that said reference cell is operated with both storage regions in a programmed state.

11. The device according to claim 10, wherein said reference cells store charge in a non-nitride layer.

12. The device according to claim 10, wherein said reference cells store charge in a charge trapping layer.

13. The device according to claim 10, wherein the charge storage regions of said reference cell are physically separated.

14. The device according to claim 10, wherein each of the charge storage regions in each cell is adapted to be charged to a difference threshold level.

15. The device according to claim 14, wherein said reference cells are adapted for reading each of at least two charge storage regions individually.

* * * * *